United States Patent
Ahn et al.

[11] Patent Number: 5,979,756
[45] Date of Patent: Nov. 9, 1999

[54] CASSETTE FOR SEMICONDUCTOR MANUFACTURE AND MANAGEMENT, METHOD FOR MANUFACTURING THE CASSETTE, AND EQUIPMENT FOR SEMICONDUCTOR FABRICATION

[75] Inventors: Chung-sam Ahn; Yong-il Lim, both of Yongin, Rep. of Korea

[73] Assignee: Samsung Electronics Co., Ltd., Suwon, Rep. of Korea

[21] Appl. No.: 08/676,830

[22] Filed: Jul. 8, 1996

[30] Foreign Application Priority Data

Jul. 8, 1995 [KR] Rep. of Korea ............... 95-20066

[51] Int. Cl.⁶ ............................................. G06K 15/00
[52] U.S. Cl. ........................................ 235/383; 235/462.13
[58] Field of Search ............................ 235/462, 472, 235/454, 383, 385, 462.13, 462.01; 206/710, 711, 712

[56] References Cited

U.S. PATENT DOCUMENTS

| | | |
|---|---|---|
| 4,582,987 | 4/1986 | Bianco ........................... 235/385 X |
| 4,644,143 | 2/1987 | McJohnson et al. ............. 235/462 |
| 4,794,238 | 12/1988 | Hampton ........................ 235/462 |
| 4,941,522 | 7/1990 | Sakurai ........................ 235/462 X |
| 5,015,832 | 5/1991 | Filipski et al. .............. 235/462 |
| 5,149,948 | 9/1992 | Chisholm ...................... 235/462 |
| 5,175,425 | 12/1992 | Spratte et al. ............... 235/462 X |
| 5,287,414 | 2/1994 | Foster ......................... 235/383 X |
| 5,567,927 | 10/1996 | Kahn et al. ................... 235/462 |
| 5,575,394 | 11/1996 | Nyseth ......................... 206/710 |

*Primary Examiner*—Donald Hajec
*Assistant Examiner*—Karl D. Frech
*Attorney, Agent, or Firm*—Jones Volentine, LLP

[57] ABSTRACT

A wafer cassette, a method for manufacturing the cassette, and equipment for semiconductor fabrication are provided. The cassette includes a container for containing wafers, a bar-code wing projecting outward from at least one of the front walls and sidewalls of the container, and a bar code formed on the surface of the bar-code wing. A bar code reader for identifying the bar codes of the cassette is provided below the upper plane of the loader/unloader portion of the equipment for semiconductor fabrication. Accordingly, an efficient loading/unloading operation of a cassette onto/from the loader/unloader portion of the equipment is enabled, wafer damage is reduced, and productivity of the manufactured semiconductor device is improved.

13 Claims, 4 Drawing Sheets

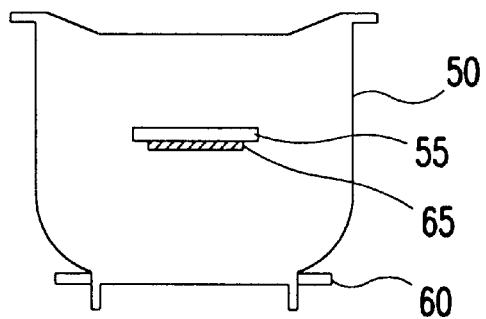
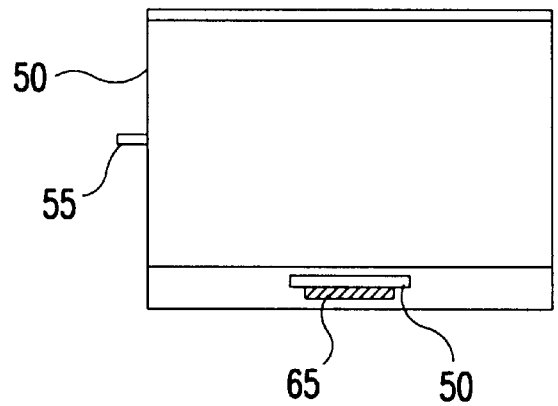
FIG. 4A
FIG. 4B
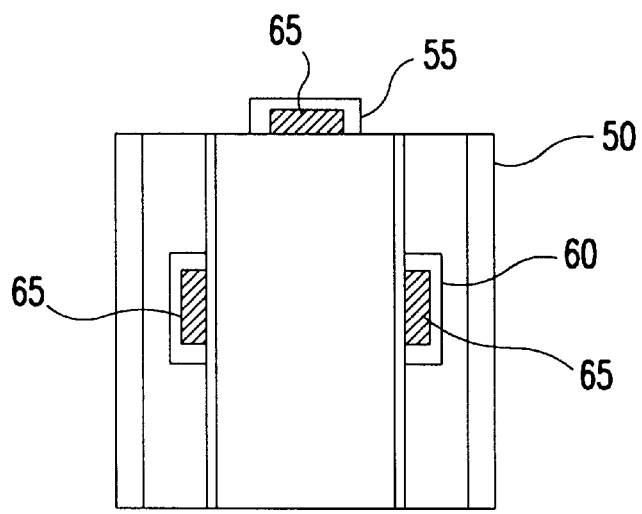
FIG. 4C

CASSETTE FOR SEMICONDUCTOR MANUFACTURE AND MANAGEMENT, METHOD FOR MANUFACTURING THE CASSETTE, AND EQUIPMENT FOR SEMICONDUCTOR FABRICATION

BACKGROUND OF THE INVENTION

The present invention relates to a semiconductor apparatus and a method for manufacturing the same, and more particularly, to a wafer cassette for use in semiconductor manufacture and management, a method for manufacturing the cassette, and equipment for semiconductor fabrication.

Currently, the automated manufacture of a semiconductor device includes three phases: a designation phase where process programs for equipment to manufacture the semiconductor device are designated by an automated system, a loading phase where a wafer cassette is loaded onto equipment by an operator or an auto-guided vehicle (AGV), and a process-performing phase. Here, in order to prevent errors in the process operation by the improper loading of the cassette onto the equipment by the operator or the AGV, a fixed bar code reader is situated on the equipment to read a bar code affixed to the cassette.

FIGS. 1A and 1B are front and side views, respectively, of a conventional cassette for semiconductor fabrication and management. Reference numeral 10 denotes a cassette and reference numeral 15 denotes a bar code.

The cassette 10, as a container for wafers, is generally used for carrying 25 wafers at a time, and the bar code 15 is used for the specific identification of the cassette 10. The bar code 15 is located on the sidewalls as well as the front wall of the cassette 10. The bar code 15 is affixed to the center of the sidewalls of the cassette 10, in parallel with the walls of the cassette 10.

FIGS. 2A and 2B illustrate a loader/unloader portion of conventional equipment for semiconductor fabrication having a cassette identifying apparatus for reading the bar codes on the front walls and side walls of the cassette 10, respectively. Here, in addition to the reference numerals used in connection with FIGS. 1A and 1B, reference numeral 20 denotes an loader/unloader portion of the equipment for semiconductor fabrication, reference numeral 30 denotes a bar code reader, reference numeral 40 denotes a beam window, and reference numeral 45 denotes a beam.

FIG. 2A is a side view of the loader/unloader portion 20 for loading/unloading a cassette, showing how to read the front bar code. The bar code reader 30, i.e., a cassette identifying apparatus, is provided in the frontal part of the loader/unloader 20 (where an operator would be positioned).

FIG. 2B is a front view of the loader/unloader 20, showing how to read the side bar code. The bar code reader 30 is installed between cassettes loaded on the loader/unloader portion 20.

When an operator or AGV loads the cassette 10 containing wafers onto the loader/unloader portion 20, the bar code reader 30 reads the bar code of the cassette 10 to ensure the proper sequence of manufacturing steps are carried out. The manufacturing process only proceeds after determining whether the identified bar code of a cassette is correct. The cassette 10 whose bar code 15 is verified by the bar code reader 30 is moved from the loader/unloader portion 20 for subsequent processing.

When the cassette 10 is loaded to place wafers contained therein perpendicularly to the upper plane of the loader/unloader portion 20, i.e., when the base plane of the cassette 10 is in contact with the upper plane of the loader/unloader portion 20, the bar code reader 30 reads the bar code inscribed on the front wall or sidewalls of the cassette 10.

On the other hand, if cassette 10 is loaded to place wafers contained therein in parallel with the upper plane of the loader/unloader portion 20, i.e., when the rear plane of the cassette 10 is in contact with the upper plane of the loader/unloader portion 20, the bar code reader 30 reads only the bar code inscribed on the sidewalls of the cassette 10. The bar code on the front wall of the cassette 10 is not read.

According to the above conventional wafer cassette and equipment for semiconductor fabrication having a cassette identifying apparatus, a change in the step sequence of a semiconductor manufacturing process is prevented by identifying the cassettes using a bar code reader. Certain disadvantages, however, are present.

First, when the bar code reader 30 is positioned in the frontal part of loader/unloader portion 20 (see FIG. 2A), it is difficult for an operator or AGV to load the cassette 10 onto the loader/unloader portion 20 since the bar code reader 30 is installed on the loader/unloader portion 20. In this conventional configuration, therefore, when loading/unloading a cassette 10, the operator or AGV must lift the cassette 10 up and over the bar code reader 30.

Second, during such a loader/unloader operation, there is a significant likelihood for the wafers to become damaged by cracking. That is, when the operator or AGV performs the loading/unloading operation, there is the potential for the cassette 10 and the bar code reader 30 to collide with each other.

Third, the number of cassettes to be loaded on the loader/unloader portion 20 is limited by the bar code reader 30, thus lowering productivity. That is, since a certain amount of space must be provided to house the bar code reader 30 and the beam 45 generated therefrom, the number of the cassettes which can be loaded on the loader/unloader portion 20 is restricted, which in turn reduces the total number of wafers which can be prepared per unit process.

SUMMARY OF THE INVENTION

An object of the present invention is to provide a cassette for semiconductor manufacture and management which allows for an efficient loading/unloading operation of the cassette onto the loader/unloader portion of equipment, reduces damage to wafers, and improves the productivity of a semiconductor device.

Another object of the present invention is to provide the most appropriate method for manufacturing the cassette.

Still another object of the present invention is to provide equipment for semiconductor fabrication, which allows an efficient loading/unloading operation of the cassette onto the loader/unloader portion, reduces damage to wafers, and improves the productivity of a semiconductor device.

To achieve the above objects, there is provided a cassette for semiconductor manufacture and management, comprising: a container having front and sidewalls for containing wafers; a bar-code wing projecting outward from at least one of the front walls and sidewalls of the container; and a bar code formed on the surface of the bar-code wing.

It is preferred that in the cassette of the present invention, the bar-code wing projects perpendicularly from the at least one wall of the container.

It is preferred that in the cassette of the present invention, bar-code wings project respectively from the front wall and sidewalls of the container. More preferably, the bar-code wing projecting from the front wall is positioned in the middle of the container, and the bar-code wings projecting from the sidewalls are positioned in one of the lower part and middle part of the container.

It is preferred that in the cassette of the present invention, the bar code is affixed to the lower surface of the bar-code wing.

To achieve another object of the present invention, there is provided a method for manufacturing a cassette for semiconductor manufacture and management, according to an embodiment of the present invention, comprising the steps of: preparing molds for a container used to contain wafers, wherein said container has front and sidewalls, and a bar-code wing projecting outward from at least one of the front walls and sidewalls of the container; manufacturing a wafer cassette having the bar-code wing, by utilizing the molds; and forming a bar code onto the bar-code wing.

According to the manufacturing method of a cassette, it is preferred that in the step of forming a bar code, the bar code is printed by a laser marking method.

Preferably, in the step of forming a bar code, the bar code is coated and then affixed onto the bar-code wing.

There is also a method for manufacturing a cassette for semiconductor manufacture and management, according to another embodiment of the present invention, comprising the steps of: preparing a container for containing wafers, wherein said container has front and sidewalls; attaching a bar-code wing to at least one of the front walls and sidewalls of the container; and forming a bar code onto the bar-code wing.

According to one manufacturing method for the cassette, the bar-code wings are attached by welding. Preferably, the bar-code wing is detachably attached to the container.

Preferably, in the step of forming a bar code, the bar code is printed by a laser marking method.

Preferably, in the step of forming a bar code, the bar code is coated and then affixed to the bar-code wing.

To achieve still another object of the present invention, there is provided equipment for semiconductor fabrication, wherein a cassette identifying apparatus is provided below the upper plane of an loader/unloader portion of the equipment for semiconductor fabrication.

Preferably, the cassette identifying apparatus is provided with a beam window from which a beam for identifying a cassette is projected.

The equipment for semiconductor fabrication further comprises a transparent window for transmitting the beam, provided at the upper plane of the loader/unloader portion of the equipment.

Accordingly, the present invention can provide for an efficient loading/unloading operation of the cassette onto/from an loader/unloader portion, can reduce damage to wafers, and can improve the productivity of a semiconductor device.

BRIEF DESCRIPTION OF THE DRAWINGS

The above objects and advantages of the present invention will become more apparent by describing in detail preferred embodiments thereof with reference to the attached drawings in which:

FIGS. 4A, 4B and 4C are respectively a front view, a side view and a base plan view of the cassette manufactured by the present invention.

DETAILED DESCRIPTION OF THE INVENTION

Figure 1A:
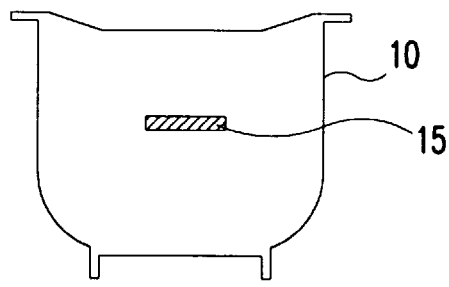
FIGS. 1A and 1B are respectively a front view and a side view of a conventional cassette for semiconductor manufacture and management.
Figure 1B:
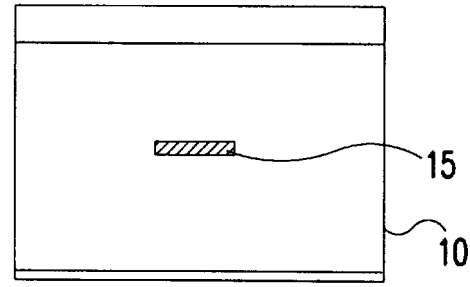
Figure 2A:
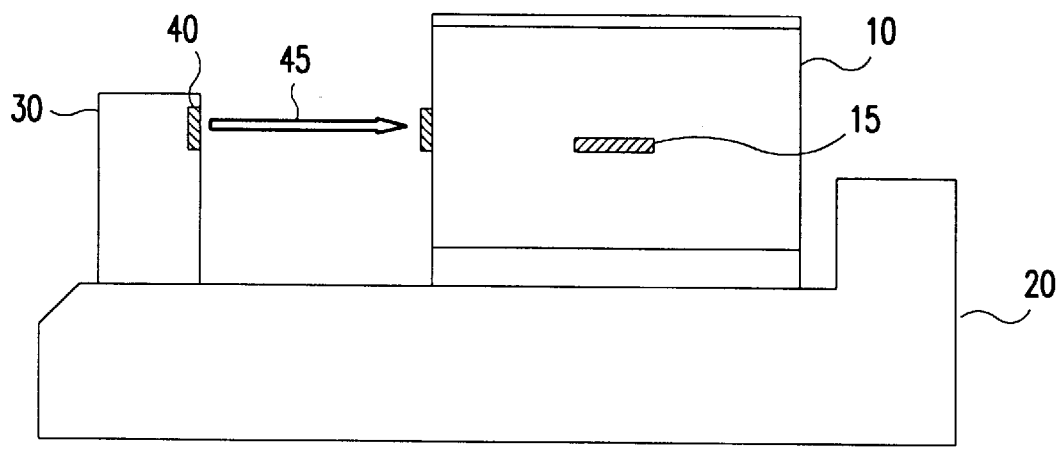
FIGS. 2A and 2B illustrate a loader/unloader portion of conventional equipment for semiconductor fabrication having a cassette identifying apparatus.
Figure 2B:
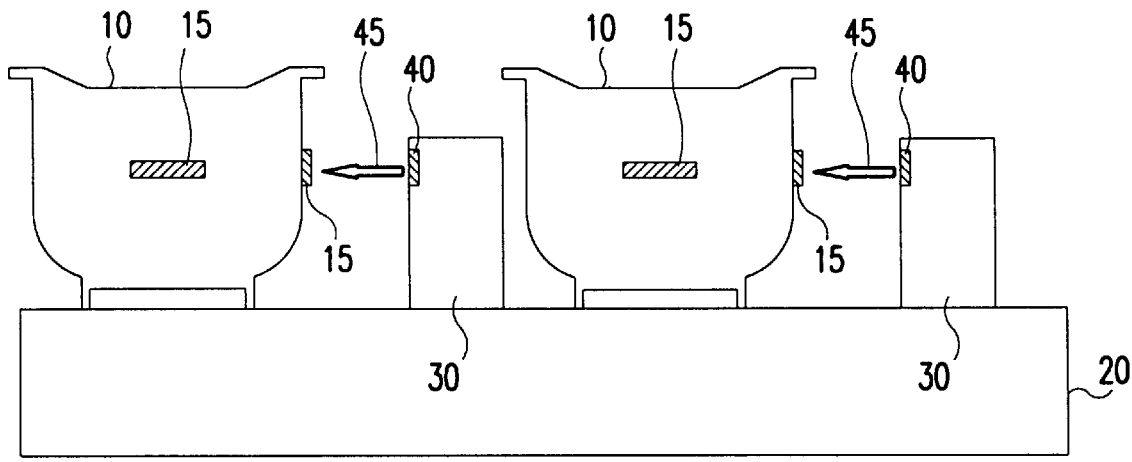
Figure 3:
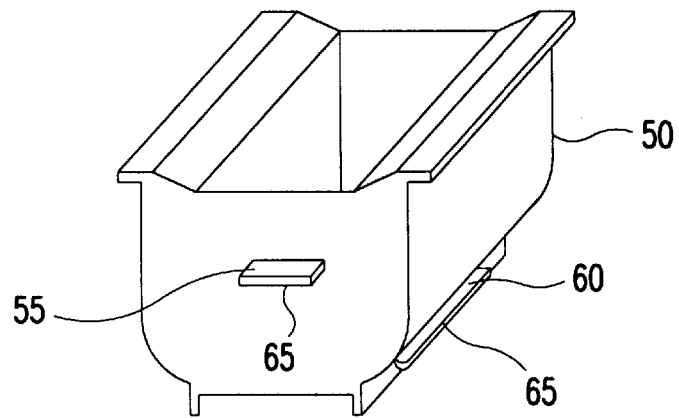
FIG. 3 is a perspective view of a cassette manufactured according to the present invention.

FIG. 3 is a perspective view of a cassette manufactured according to the present invention, and FIGS. 4A, 4B and 4C are front, side and bottom views thereof, respectively. Here, reference numeral 50 denotes a container, reference numeral 55 denotes a front bar-code wing, and reference numeral 60 denotes a side bar-code wing.

The front and side bar-code wings 55 and 60 project outward from the middle of the front wall and the lower or middle of the sidewalls of the container 50, respectively. The container 50 is used for containing wafers and the bar-code wings 55 and 60 are used for printing or affixing the bar code 65 onto the respective lower surfaces of each of the bar-code wings. The bar-code wings 55 and 60 preferably project perpendicularly from the sidewalls of the container 50, but may be positioned at some other angle. A bar code is also printed or affixed on the rear of the container 50, so as to be positioned on the left and/or right thereof (not shown).

There are generally two methods for manufacturing the above-described cassette: a first method in which the cassette is manufactured after preparing molds; and a second method in which the bar-code wings are attached after fabricating a container.

The first method includes the steps of preparing molds for a container to contain wafers and bar-code wings projecting from the front walls and sidewalls of the container, manufacturing a wafer cassette having the projected bar-code wings, using the molds, and forming bar codes onto the bar-code wings. Here, the step of forming bar codes may be performed by one of two ways: by printing the bar codes on the bar-code wings using a laser marking method, or by coating sheets having the bar codes printed thereon and then affixing the coated sheets to the bar-code wings with an adhesive.

The second method includes the steps of preparing a container, attaching bar-code wings to the front walls and sidewalls of the container, and forming bar codes onto the bar-code wings. Here, the bar-code wings can be attached by welding, or they may be attached by other less rigid methods so as to be detachably attached to the container. In either case, however, the bar code wings may be removed from the container if desired. The formation of the bar codes is performed in the same manner as in the first method.

Figure 5A:
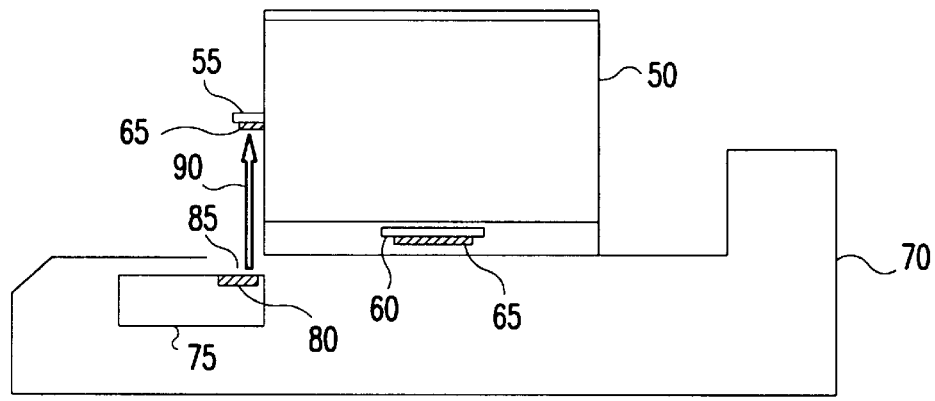
FIGS. 5A and 5B illustrate a loader/unloader portion of equipment for semiconductor fabrication having a cassette identifying apparatus according to the present invention.
Figure 5B:
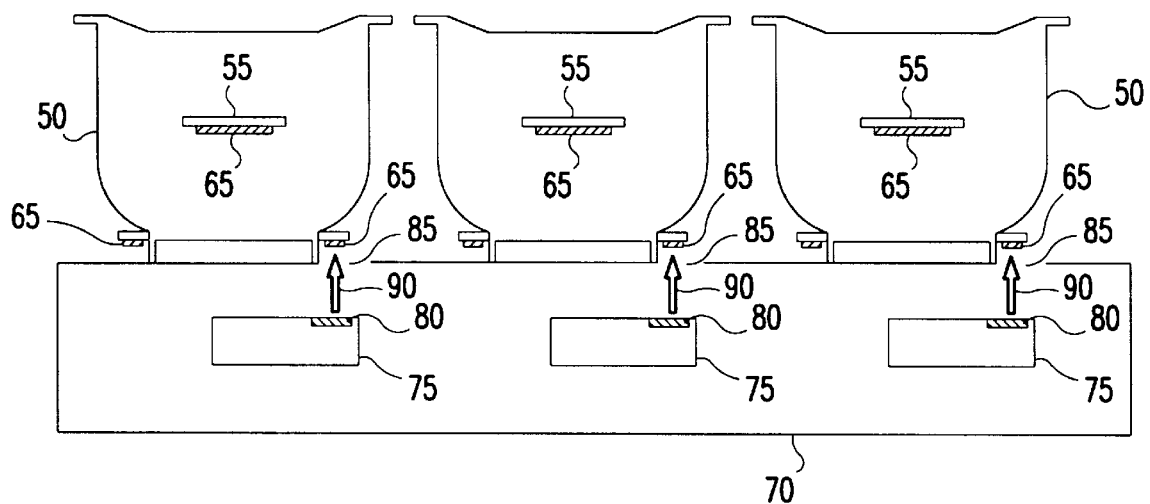

FIGS. 5A and 5B illustrate the loader/unloader portion of equipment for semiconductor fabrication having a cassette identifying apparatus for reading the bar codes of the front and side bar-code wings 55 and 60, respectively. Here, in addition to the reference numerals used in connection with FIGS. 3 and 4A–4C, reference numeral 70 denotes a loader/unloader portion, reference numeral 75 denotes a bar code reader, reference numeral 80 denotes a beam window, reference numeral 85 denotes a transparent window, and reference numeral 90 denotes a beam.

The bar code reader 75 is installed below the upper plane of the loader/unloader portion 70 and provided with the beam window 80. Also, the transparent window 85 is formed on the upper plane of the loader/unloader portion 70, to be larger than the beam window 80, and positioned so that the beam 95 generated from beam window 80 is vertically projected to bar code 65.

When the cassette 50 is loaded to place wafers contained therein perpendicularly with respect to the upper plane of the loader/unloader portion 70, the cassette 50 with the bar-code wing 55 is loaded on the loader/unloader portion 70 having the bar code reader 75 below the upper plane thereof. Here, the bar-code wing 55 should be positioned so that the beam 90 of the beam window 80 transmitted through the transparent window 85 is vertically projected thereto. The beam 90 generated from the beam window 80 is projected through the transparent window 85 to the front bar-code wing 55 and/or the side-bar wing code 60, and reads the bar codes 65 affixed to the bar-code wings 55 and 60 (see FIGS. 5A and 5B).

When the cassette is loaded to place wafers contained therein in parallel with the upper plane of the loader/unloader portion (not shown), the cassette is loaded in such a way that the rear plane of the container is in contact with the upper plane of the loader/unloader portion having the bar code reader below the upper plane thereof. Here, a bar code (not shown) printed or affixed to the rear plane of the container should be positioned so that the beam of the beam window transmitted through the transparent window is vertically projected thereto.

Accordingly, by providing a cassette identifying apparatus below the upper plane of an loader/unloader portion, the present invention has distinct advantages: (1) an efficient cassette loading/unloading operation can be performed since an operator or AGV need not lift a cassette as high as a bar code reader; (2) damage to wafers can be reduced since there can be no collision of the bar code reader and cassette; and (3) the productivity of a semiconductor device can be improved since the space between the bar code reader and cassette, as well as that occupied by the bar code reader itself, can be utilized for loading the cassette.

The present invention is not restricted to the above embodiments, and it is clearly understood that a lot of variations may be made within the scope and spirit of the present invention by those skilled in the art.

What is claimed is:

1. A cassette for semiconductor manufacture and management, comprising:
   a container having front and sidewalls for containing wafers;
   a bar-code wing projecting outward from at least one of the front walls and sidewalls of said container; and
   a bar-code formed on the lower surface of said bar-code wing, so that said bar-code can be read by a cassette identifying apparatus positioned below said container.

2. A cassette for semiconductor manufacture and management as claimed in claim 1, wherein said bar-code wing projects perpendicularly from said at least one wall of said container.

3. A cassette for semiconductor manufacture and management as claimed in claim 1, wherein bar-code wings project respectively from the front wall and sidewalls of said container.

4. A cassette for semiconductor manufacture and management as claimed in claim 3, wherein said bar-code wing projecting from the front wall is positioned at a middle part of said container, and said bar-code wings projecting from the sidewalls are positioned in one of the lower part and middle part of said container.

5. A method for manufacturing a cassette for semiconductor manufacture and management, comprising the steps of:
   preparing molds for a container used to contain wafers, wherein said container has front walls and sidewalls, and a bar-code wing projecting outward from at least one of the front walls and sidewalls of said container;
   manufacturing a wafer cassette having said bar-code wing, by utilizing said molds; and
   forming a bar code onto a layer surface of said bar-code wing.

6. A method for manufacturing a cassette for semiconductor manufacture and management as claimed in claim 5, wherein, in said step of forming a bar code, said bar code is printed by a laser marking method.

7. A method for manufacturing a cassette for semiconductor manufacture and management as claimed in claim 5, wherein, in said step of forming a bar code, said bar code is coated and then affixed onto said bar-code wing.

8. A method for manufacturing a cassette for semiconductor manufacture and management, comprising the steps of:
   preparing a container for containing wafers, wherein said container has front walls and sidewalls;
   attaching a substantially perpendicular, outwardly projecting bar-code wing to at least one of the front walls and sidewalls of said container; and
   forming a bar code onto a lower downwardly facing surface of said bar-code wing so that said bar code can be read bu. a cassette identifying apparatus positioned below said projecting bar-code wing.

9. A method for manufacturing a cassette for semiconductor manufacture and management as claimed in claim 8, wherein said bar-code wing is detachably attached to said container.

10. A method for manufacturing a cassette for semiconductor manufacture and management as claimed in claim 8, wherein, in said step of forming a bar code, said bar code is printed by a laser marking method.

11. A method for manufacturing a cassette for semiconductor manufacture and management comprising:
   preparing a container for containing wafers, wherein said container has front walls and sidewalls;
   welding an outwardly projecting bar-code wing to at least one of the front walls and sidewalls of said container; and
   forming a bar code onto a lower surface of said bar-code wing.

12. A method for manufacturing a cassette for semiconductor manufacture and management comprising:
   preparing a container for containing wafers, wherein said container has front walls and sidewalls;

attaching an outwardly projecting bar-code wing to at least one of the front walls and sidewalls of said container; and forming a bar code onto a lower surface of said bar-code wing be coating said bar code and then affixing the coated bar code to said bar-code wing.

13. Equipment for semiconductor fabrication, comprising:

a cassette identifying apparatus, and a loader/unloader portion of said equipment for semiconductor fabrication, wherein said cassette identifying apparatus is provided below an upper plane of said loader/unloader portion oriented such that said cassette identifying apparatus reads a bar code provided on a lower surface of an outwardly projecting bar-code wing of a semiconductor cassette.

* * * * *